US012674229B2

(12) United States Patent
Lin et al.

(10) Patent No.: US 12,674,229 B2
(45) Date of Patent: Jul. 7, 2026

(54) METAL MASK

(71) Applicant: DARWIN PRECISIONS CORPORATION, Hsinchu County (TW)

(72) Inventors: Chi-Wei Lin, Hsinchu County (TW); Chi-Wei Lin, Hsinchu County (TW)

(73) Assignee: DARWIN PRECISIONS CORPORATION, Hsinchu County (TW)

( * ) Notice: Subject to any disclaimer, the term of this patent is extended or adjusted under 35 U.S.C. 154(b) by 450 days.

(21) Appl. No.: 18/221,909

(22) Filed: Jul. 14, 2023

(65) Prior Publication Data

US 2024/0240301 A1 Jul. 18, 2024

(30) Foreign Application Priority Data

Jan. 16, 2023 (TW) ................................. 112101729

(51) Int. Cl.
*C23C 14/04* (2006.01)
*C23C 14/24* (2006.01)
(52) U.S. Cl.
CPC ............ *C23C 14/042* (2013.01); *C23C 14/24* (2013.01)
(58) Field of Classification Search
None
See application file for complete search history.

(56) References Cited

FOREIGN PATENT DOCUMENTS

| | | | |
|---|---|---|---|
| CN | 113206138 A | 8/2021 | |
| CN | 113981367 A | 1/2022 | |
| KR | 20210094261 A | * 7/2021 | ........... C23C 14/042 |
| TW | 202129439 A | 8/2021 | |
| TW | 745299 B | 11/2021 | |

OTHER PUBLICATIONS

Machine Translation of KR 20210094261.*

* cited by examiner

*Primary Examiner* — Christopher T Schatz

(57) ABSTRACT

A metal mask includes a metal body and a plurality of through-holes. The metal body has a first surface and a second surface, and the plurality of through-holes penetrate the metal body and respectively have openings on the first surface and the second surface, where each of the through-holes has a first opening, a second opening, and a third opening. The first opening is formed on the first surface; the second opening is formed on the second surface and is smaller than the first opening; the third opening is located within the through-hole and between the first opening and the second opening, and the third opening is smaller than the second opening. Each of the through-holes further has a first length and a second length, and the first length is greater than the second length.

8 Claims, 5 Drawing Sheets

METAL MASK

FIELD OF THE INVENTION

The present invention relates to a metal mask, in particular to a slotted metal mask that can be used for evaporation.

BACKGROUND OF THE INVENTION

The metal mask is commonly used in the display industry, for example in the manufacture of display panels, to vaporize pixel material onto a substrate to form a pixel pattern. The metal mask has a plurality of evaporation holes corresponding to positions where a pixel pattern is to be formed on the substrate during the evaporation. The metal mask is typically secured to a support for an evaporation operation, where the securing expands the metal mask and creates tension thereon. Wrinkles may be produced if the metal mask is under tension, etc., which may affect the through-hole shape, and then affect the evaporation quality, such as spread plating and color mixing.

SUMMARY OF THE INVENTION

The present invention provides a metal mask that has better structural strength, better flatness under tension, helps to improve the shadow effect, and improves the reliability and the yield rate of evaporation result.

The present invention also provides an evaporation jig with good flatness, helping to improve the shadow effect and improving the evaporation quality.

The present invention provides a metal mask comprising a metal body and a plurality of through-holes. The metal body has a first surface and a second surface, and the plurality of through-holes penetrate the metal body and respectively have openings on the first surface and the second surface, where each of the through-holes has a first opening, a second opening, and a third opening. The first opening is formed on the first surface; the second opening is formed on the second surface and is smaller than the first opening; the third opening is located within the through-hole and between the first opening and the second opening, and the third opening is smaller than the second opening. Each of the through-holes further has a first length and a second length, and the first length is greater than the second length.

According to one embodiment of the present invention, the third opening of each of the through-holes has a first aperture in a direction of the first length and a second aperture in a direction of the second length, and the first aperture is at least three times the second aperture.

According to one embodiment of the present invention, the plurality of through-holes is spaced apart in the direction of the second length, and the plurality of through-holes are spaced apart a first spacing between adjacent first openings of the first surface and a second spacing between adjacent second openings of the second surface; where the first spacing and the second spacing are not zero.

According to one embodiment of the present invention, a length of the second spacing is not less than the second aperture.

According to one embodiment of the present invention, the metal body has a thickness in a penetration direction of the plurality of through-holes, and the thickness is not more than 50 μm, and the second aperture of each of the through-holes is no greater than 80 μm.

According to one embodiment of the present invention, the thickness of the metal body is not less than 15 μm, and the second aperture of each of the through-holes is not less than 15 μm.

The present invention provides an evaporation jig comprising the above-mentioned metal mask and a frame. The frame comprises a first frame wall and a second frame wall which are located on opposite sides of the frame. The metal mask has a first end and a second end in the direction of the first length, and the first end of the metal mask is connected to the first frame wall, and the second end is connected to the second frame wall to be fixed to the frame.

The through-holes of the metal mask of the present invention have the first length greater than the second length and are elongated, and the second aperture of the third opening in the through-hole in the direction of the second length is less than or equal to the second spacing, and the second spacing and the first spacing are not zero, so that the structural strength of the metal mask and the flatness under tension can be maintained or improved, thereby contributing to the improvement of the shadow effect and the reliability and the yield rate of the evaporation result.

Other objectives, features and advantages of the invention will be further understood from the further technological features disclosed by the embodiments of the invention wherein there are shown and described preferred embodiments of this invention, simply by way of illustration of modes best suited to carry out the invention.

DETAILED DESCRIPTION OF PREFERRED EMBODIMENTS

The foregoing and other objects, features and advantages of the invention will be apparent from the following more particular description of preferred embodiments of the invention, as illustrated in the accompanying drawings. The directional terms used in the following examples refer only to the directions of the accompanying drawings. Therefore, directional terminology is used to describe and not to limit the invention. In addition, references to "first", "second", and the like in the description or claims are merely used to name an element or to distinguish between different embodiments or ranges and are not intended to limit the upper or lower limit on the number of components.

Figure 1:
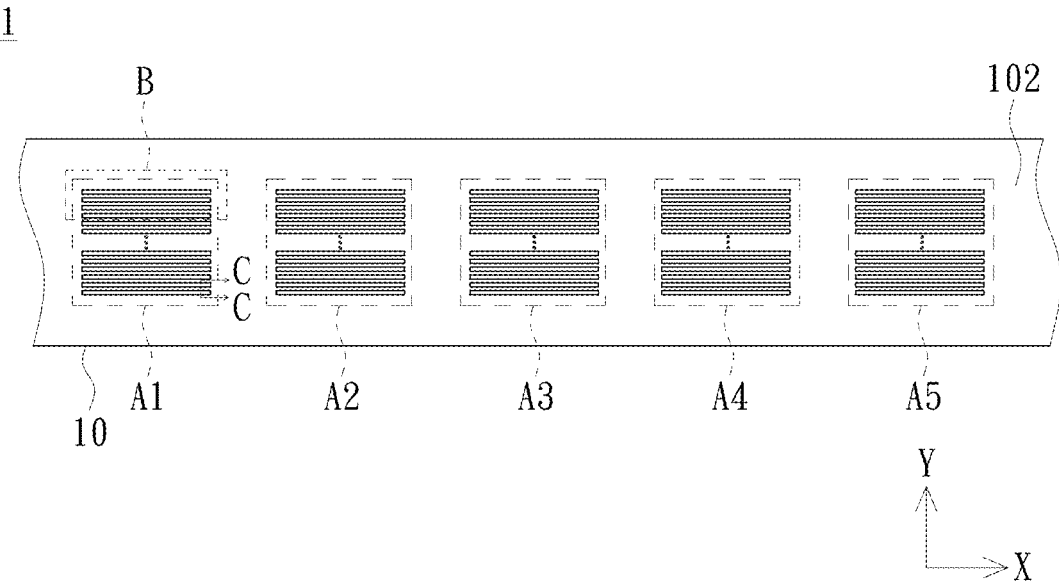
FIG. 1 is a schematic top view of a metal mask according to one embodiment of the present invention.
Figure 2:
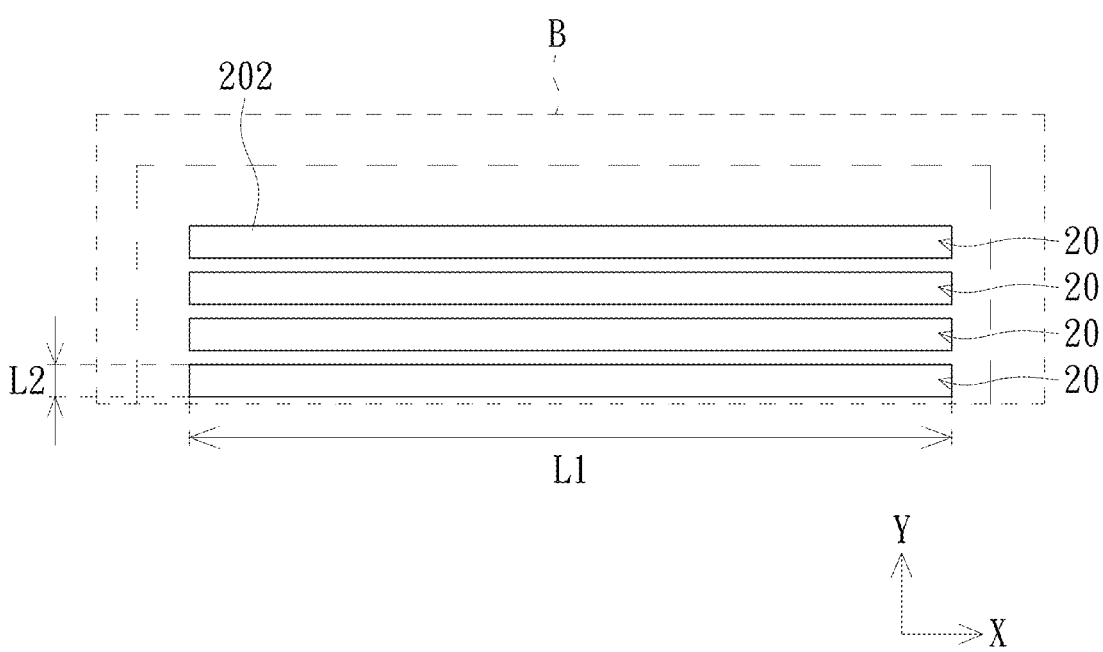
FIG. 2 is a partially enlarged schematic view of FIG. 1.
Figure 3:
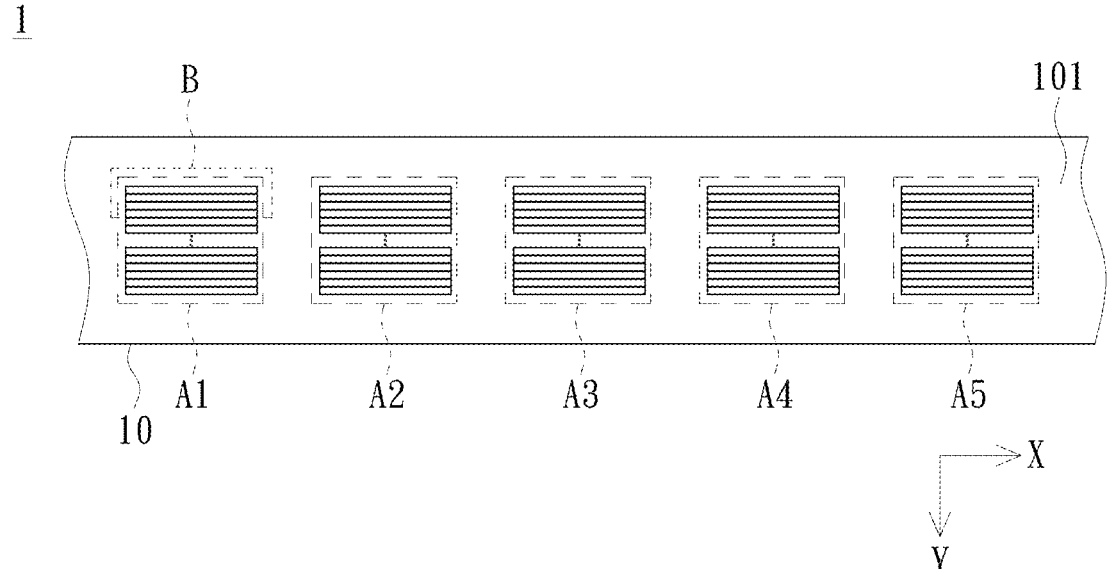
FIG. 3 is a schematic bottom view of a metal mask according to one embodiment of the present invention.
Figure 4:
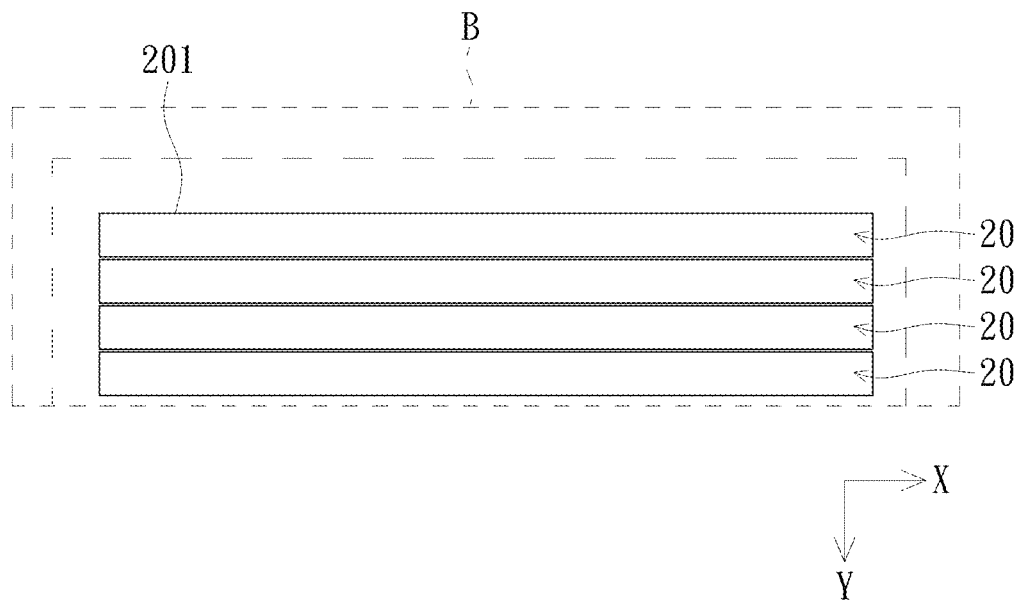
FIG. 4 is a partially enlarged schematic view of FIG. 3.

FIG. 1 is a schematic top view of a metal mask according to one embodiment of the present invention, FIG. 2 is an enlarged view of a portion B of FIG. 1, FIG. 3 is a schematic bottom view of the metal mask according to the embodiment of the present invention, and FIG. 4 is an enlarged view of the portion B of FIG. 3. As shown in FIG. 1, according to the embodiment of the invention, the metal mask 1 comprises a metal body 10. Preferably, the metal body 10 is in the form of a plate having a first surface 101 and a second surface 102 opposite to each other, and further, a thickness TH of the plate is preferably between 15 μm and 50 μm. The viewing angle of FIGS. 1-2 is that of looking down the metal mask 1 facing the second surface 102, and the viewing angle of FIGS. 3-4 is that of looking up the metal mask 1 facing the first surface 101. When the metal mask 1 is used, for example, in an evaporation operation, the first surface 101 can serve as an evaporation surface and the second surface 102 can face, for example, a substrate surface such as a glass plate.

As shown in FIGS. 1 to 4, the metal mask 1 further comprises a plurality of through-holes 20 penetrating the metal body 10. The plurality of through-holes 20 have openings on the first surface 101 and the second surface 102 respectively, and each of the through-holes 20 has a first opening 201 on the first surface 101 and a second opening 202 on the second surface 102. According to one embodiment of the present invention, the first opening 201 is substantially aligned with the second opening 202, and the second opening 202 is smaller than the first opening 201, and preferably a line between the center of the first opening 201 and the center of the second opening 202 is perpendicular to the first surface 101 and the second surface 202. That is, horizontal offsets between the center of the first opening 201 and the center of the second opening 202 are within an appropriate range. A suitable range of the offsets is preferably no more than 3 μm, and more preferably zero. Comparing FIGS. 4 and 3, it can be seen that the first opening 201 is similar to an opening that is enlarged on all sides with respect to the second opening 202 with a constant center.

As shown in FIG. 2, according to the embodiment of the present invention, the plurality of through-holes 20 have substantially the same shape and are regularly arranged with each other. Preferably, the shape of the through-holes 20 generally has a first length L1 and a second length L2, and the first length L1 is greater than the second length L2, and a direction of the first length L1 (i.e., the X-direction) is generally perpendicular to a direction of the second length L2 (i.e., the Y-direction). That is, the through-holes 20 are substantially elongated. For ease of illustration, L1 and L2, etc. are indicated in FIG. 2 as being adjacent to the second opening 202, however, it is to be understood that the first length L1 and the second length L2 still refer herein to the lengths of the through-hole 20 and are not necessarily equal to lengths of the second opening 202 in the X-direction and the Y-direction.

The through-holes 20 can, for example, be substantially rectangular in shape, with the long side of the rectangle having substantially the first length L1 and the short side having substantially the second length L2. Shapes of the first opening 201 and the second opening 202 are also correspondingly elongated, for example rectangular. In other embodiments, the shape of the through-holes 20 can also be, for example, elliptical, and the major axis of the elliptical shape can generally have the first length L1 and the minor axis can have the second length L2. It will be appreciated that for ease of illustration and description, the first opening 201 and the second opening 202 in FIGS. 1-4 are shown as rectangular, but can in fact be approximately rectangular, that sides of the openings can be non-linear, and that corners of the openings can be non-sharp.

Figure 5:
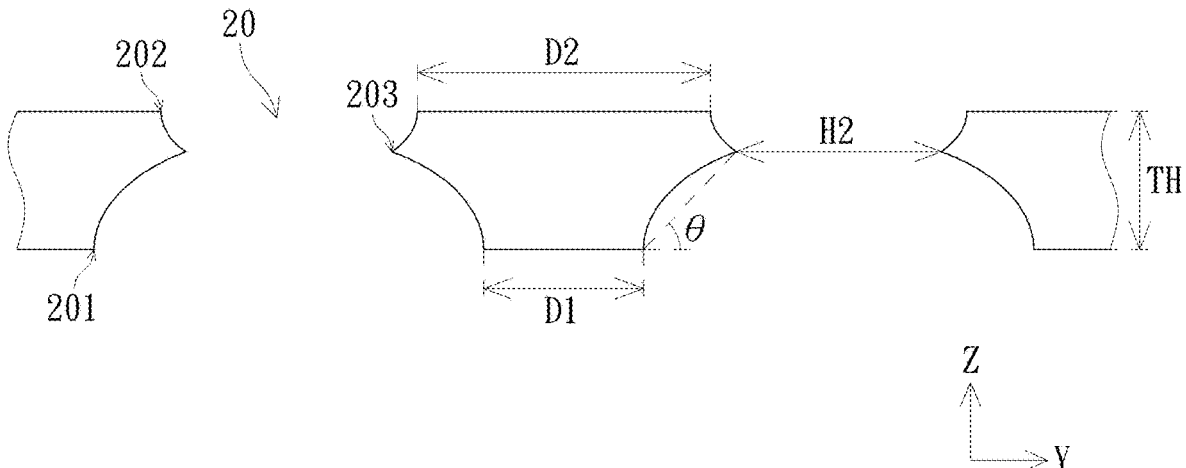
FIG. 5 is a schematic partial cross-sectional view of FIG. 1.

As shown in FIG. 2, a plurality of through-holes 20 are arranged in the Y direction. Preferably, the plurality of through-holes 20 are arranged in a substantially parallel side-by-side relationship with each other, but not limited thereto. For example, the plurality of through-holes 20 can also be staggered in the X direction so that head and tail portions of adjacent through-holes 20 are staggered with respect to each other. According to a preferred embodiment of the present invention, the plurality of through-holes 20 are spaced apart from each other, that is, the plurality of through-holes 20 do not communicate with each other. As shown in FIGS. 2 and 4, because the first opening 201 is substantially aligned with the second opening 202 and the first opening 201 is larger than the second opening 202, the first openings 201 of adjacent through-holes 20 are also closer together than the second openings 202. FIG. 5 is a cross-sectional view taken along line CC of FIG. 1. As shown in FIG. 5, the first openings 201 of adjacent through-holes 20 are separated by a first spacing D1 in the Y direction, and the second openings 202 are separated by a second spacing D2 in the Y direction. The first spacing D1 and the second spacing D2 are not zero, and the first spacing D1 is smaller than the second spacing D2.

Figure 6:
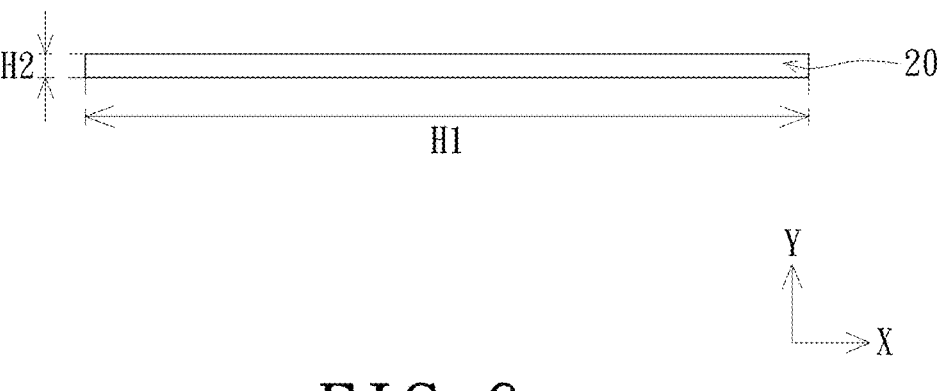
FIG. 6 is a schematic top view of a third opening according to an embodiment of the present invention.

As shown in FIG. 5, the through-hole 20 further has a third opening 203. The third opening 203 is in the through-hole 20 and between the first opening 201 and the second opening 202. According to one embodiment of the present invention, the third opening 203 is also substantially aligned with the first opening 201 and the second opening 202. That is, horizontal offsets between the center of the third opening 203 and the center of the first opening 201 or the center of the second opening 202 is within an appropriate range. A suitable range of the offsets is preferably no more than 3 μm, and more preferably zero. Here, the third opening 203 is smaller than the second opening 202. FIG. 6 shows a schematic view of the third opening 203 on an XY plane. As shown in FIGS. 5-6, the third opening 203 is similar to an opening that is retracted relative to the second opening 202 with the center being stationary. According to one embodiment of the present invention, the third opening 203 has a first aperture H1 in the X-direction and a second aperture H2 in the Y-direction, and the first aperture H1 is larger than the second aperture H2, and preferably the second aperture H2 is also smaller than or equal to the second spacing D2 between adjacent second openings 202. According to a preferred embodiment of the invention, the first aperture H1 is at least three times larger than the second aperture H2 which is preferably between 15 μm and 80 μm.

When the metal mask 1 is used in, for example, an evaporation operation, the third openings 203 can be equivalently evaporation holes. As described above, the third opening 203 is smaller than the second opening 202, and further, a connecting line of the third opening 203 and the first opening 201 on a YZ plane forms an included angle θ with respect to the Y direction, and θ is less than 90 degrees. According to an embodiment of the present invention, θ can range from 30 deg. to 70 deg. As shown in FIG. 5, an inner wall of the through-hole 20 between the third opening 203 and the second opening 202 and an inner wall of the through-hole 20 between the third opening 203 and the first opening 201 have concave curved surfaces. According to an embodiment of the present invention, the concave curved surfaces can be formed by manufacturing the through-holes 20 and the first opening 201, the second opening 202, and the third opening 203 thereof. For example, the concave curved surface of the inner wall can result from etching the metal body 10. However, the present invention does not limit the manner in which the through-hole 20 is formed and the type of the inner wall thereof.

As shown in FIGS. 1 and 3, according to the embodiment of the present invention, the metal mask 1 can further comprise a plurality of regions such as regions A1-A5, each region A1, A2, A3, A4, and A5 having the plurality of through-holes 20 spaced apart in the Y direction as previously described. The number of through-holes 20 in each region A1, A2, A3, A4, and A5 can be adjusted as desired and is not intended to be limiting as shown in the figures. According to a preferred embodiment of the present invention, a plurality of regions are spaced apart in the X-direction, but this is not a limitation. For example, the plurality of regions can be spaced side-by-side as shown in FIGS. 1 and 3, or can be staggered with respect to each other (not shown).

The metal mask 1 according to an embodiment of the present invention can be used, for example, in an evaporation operation. Further, the metal mask 1 can be expanded and connected to a support as an evaporation jig, where the metal mask 1 can be expanded and fixed to the support through tension. In several cases, a direction of the tension is parallel to the X-direction. When the metal mask is a poor design, such as a poor structure, the aforementioned tension fixing can cause the metal mask to wrinkle and affect the through-holes' shape and thus the evaporation result. Based on this, the present invention was tested to evaluate the reliability of the evaporated mask 1 according to embodiments of the present invention as follows.

Figure 7A:
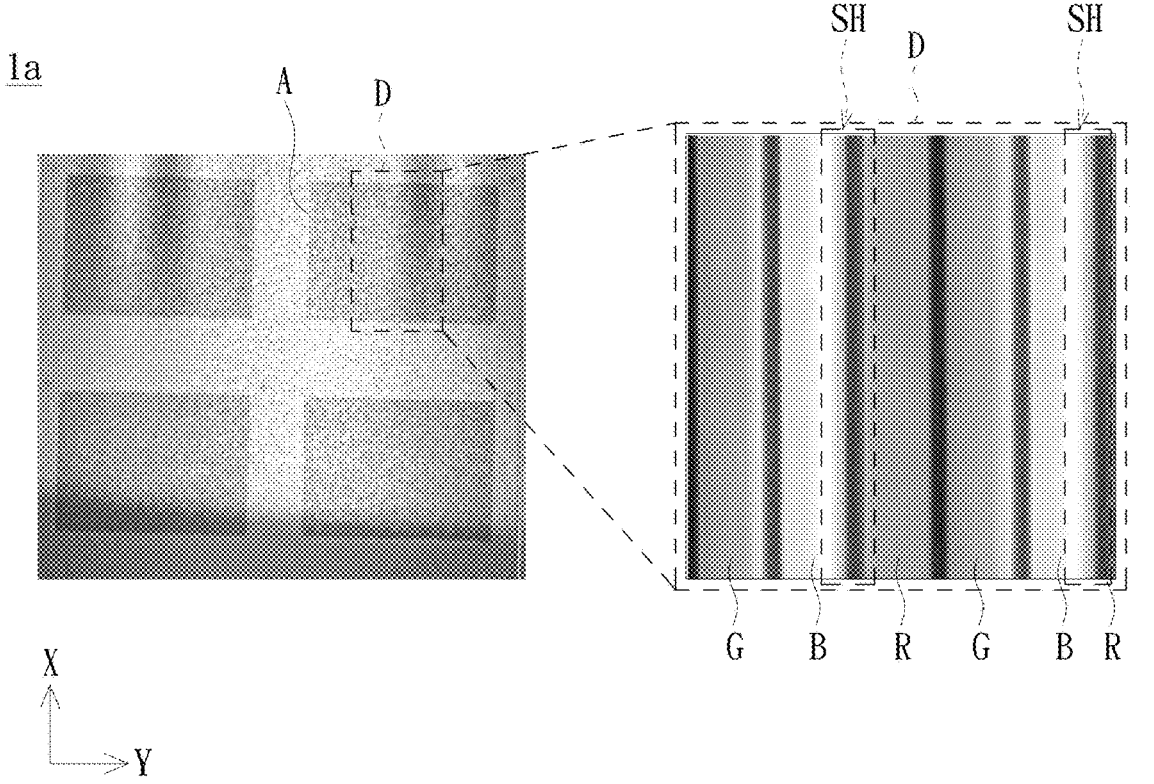
FIGS. 7A-7B are schematic photographs of Experimental examples of the present invention.
Figure 7B:
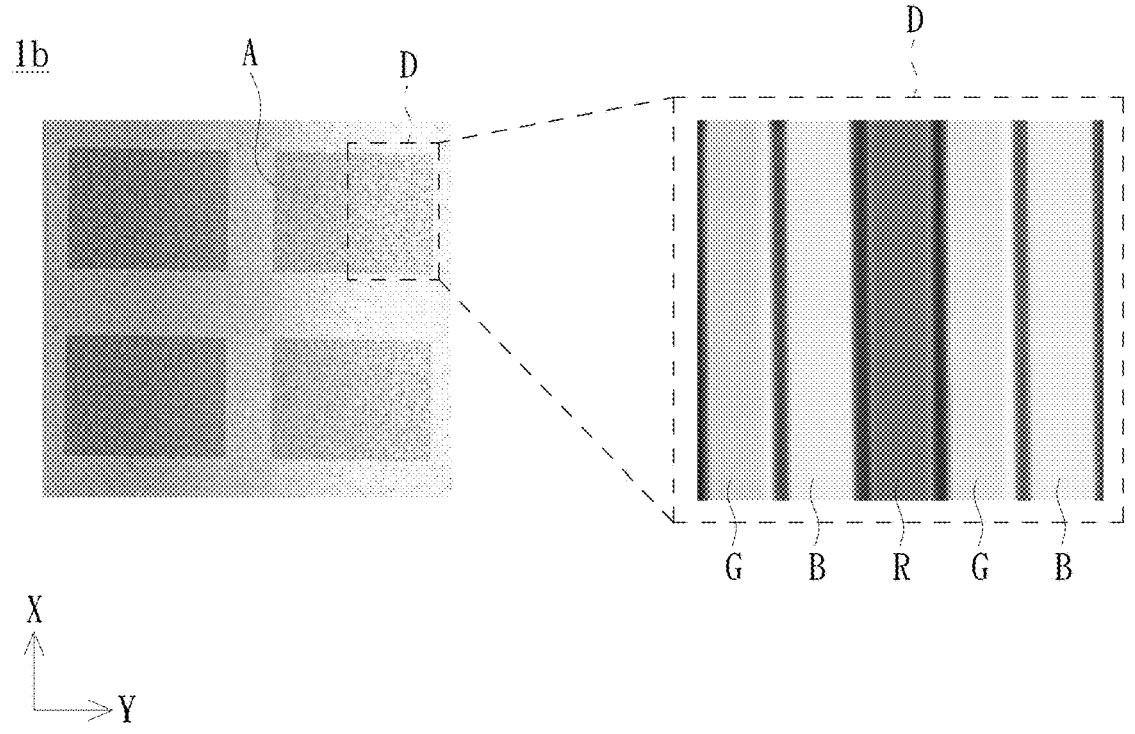

Test:

(1) method: in Experimental examples 1 to 12, fixing of the metal mask and pixel evaporation were performed, respectively. A difference among the Experimental examples 1 to 12 is the metal mask. There is at least one difference in H2, D2, D1, θ, TH values among the metal masks, as shown in Table 1.

left of FIG. 7B. The region A of the metal masks 1a and 1b has the plurality of through-holes, and the H2, D2, D1, θ, TH values of the through-holes are as shown in Table 1. As shown in FIG. 7A, the metal mask 1a of Experimental example 3 was wrinkled after being fixed by tension, indicating that its structure may be poor. Based on the fact that the second aperture H2 is not smaller than the second spacing D2 in Experimental example 3, it is presumed that the structure of the metal mask 1a is affected thereby. Referring to Experimental example 7, as shown in FIG. 7B, the metal mask 1b was maintained flat after being fixed under tension, indicating that its structure works normal.

(2-2) In Experimental examples 1 to 12, the fixed metal masks were used for pixel evaporation, and a pixel pattern was observed for shadow effect. Taking Experimental examples 3 and 7 as an example, the pixel pattern formed at the dotted line box D of the metal mask 1a is enlarged on the right in FIG. 7A, and the pixel pattern formed at the dotted line box D of the metal mask 1b is enlarged on the right in FIG. 7B. As shown in FIG. 7A, in Experimental example 3, shadow effect SH was observed at least on the left of the center R block of the RGB pixel pattern, indicating a case where spread plating is possible. The included angle θ of the through-hole of the metal mask 1a is 83.7 deg. In general, the spread plating easily occurs when the included angle θ is less than 30 deg. The included angle θ of the through-holes of the metal mask 1a is 83.7 deg., so it is more likely that the wrinkles affect the through-hole shape and results in the unevenness when attaching to the substrate, thus producing the shadow effect and affecting the evaporation result. Referring to Experimental example 7, comparing FIG. 7B with FIG. 7A, no shadow effect was observed, indicating no or no significant spread plating, and the evaporation result was acceptable.

TABLE 1

| Experimental examples | Second aperture H2 | Second spacing D2 | First spacing D1 | Included angle θ | Thickness TH | Evaporation result (shadow effect ≤ ±3 μm) |
|---|---|---|---|---|---|---|
| 1 | 30 | 48.23 | 23.33 | 58.1 | 20 | ○ |
| 2 | 30 | 39.1 | 0 | 56.9 | 20 | X |
| 3 | 30 | 24.57 | 17.91 | 83.7 | 30 | X |
| 4 | 30 | 22.88 | 0 | 69.1 | 30 | X |
| 5 | 50 | 69.37 | 0 | 40.9 | 30 | X |
| 6 | 50 | 44.5 | 28.3 | 68 | 20 | X |
| 7 | 50 | 76.03 | 29.48 | 52.2 | 30 | ○ |
| 8 | 50 | 66.61 | 0 | 42 | 30 | X |
| 9 | 70 | 71.32 | 0 | 29.3 | 20 | X |
| 10 | 70 | 51.09 | 0 | 49.6 | 30 | X |
| 11 | 70 | 54.8 | 31.61 | 65.1 | 25 | X |
| 12 | 70 | 120.11 | 56.9 | 43.5 | 30 | ○ |

(2) Results:

(2-1) In Experimental examples 1 to 12, appearances of the fixed metal masks were examined. Generally, the appearances and states of the metal masks can be roughly confirmed with naked eyes. Taking Experimental examples 3 and 7 for example, schematic photographs of the Experimental examples 3 and 7 are as shown in FIG. 7A and FIG. 7B, respectively, and schematic photographs of the metal masks are shown on the left. The appearances and states of the metal masks that can be observed with the naked eyes are roughly shown on the left of FIG. 7A and on the left of FIG. 7B, where the state of the metal mask 1a of Experimental example 3 in a fixed state and under tension is shown on the left of FIG. 7A, and the metal mask 1b of Experimental example 7 in a fixed state and under tension is shown on the Evaluation of the shadow effect was also performed in Experimental examples 1-2, 4-6, and 8-12, wherein in Experimental examples 1 and 12 and Experimental example 7 described above, the shadow effect, if any, was within ±3 μm, indicating that the evaporation results were acceptable.

Figure 8:
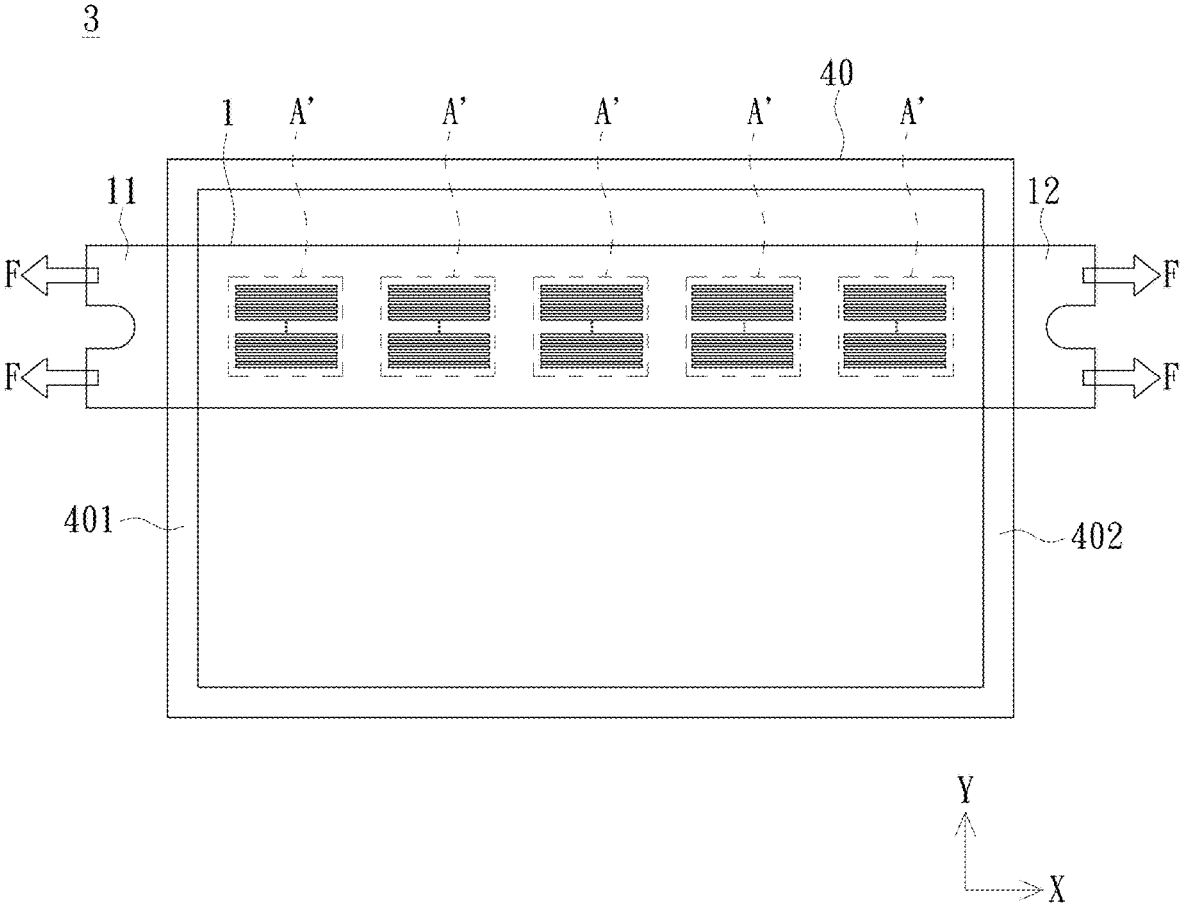
FIG. 8 is a schematic top view of an evaporation jig according to an embodiment of the present invention.

The present invention also provides an evaporation jig. FIG. 8 is a schematic top view of an evaporation jig according to an embodiment of the present invention. As shown in FIG. 8, the evaporation jig 3 includes the metal mask 1 as described above and a frame 40. The frame 40 comprises a first frame wall 401 and a second frame wall 402 which are located on two opposite sides of the frame 40. The metal mask 1 has a first end 11 and a second end 12 in the X direction, the first end 11 being connected to the first frame wall 401, and the second end 12 being connected to the second frame wall 402 and fixed to the frame 40. Further, the metal mask 1 is more fixed to the frame 40 and has tension. As shown in FIG. 8, the direction of the tension F is at least parallel to the X-direction, and the tension F expands the metal mask 1 fixed to the frame 40 from the first end 11 and the second end 12 in a direction away from the metal mask 1. According to the embodiments of the present invention, the tension F is preferably no greater than 15N, but not limited thereto. The magnitude of the tension F can be adjusted depending on the structure of the metal mask 1. According to some embodiments of the present invention, the metal mask 1 can further comprise a plurality of evaporation areas A', each evaporation area A' having the plurality of through-holes 20, and the plurality of evaporation areas A' being arranged at intervals in the X direction.

According to some embodiments of the present invention, the metal mask 1 can further comprise the plurality of evaporation areas A', each evaporation area A' having the plurality of through-holes 20, and the plurality of evaporation areas A' being arranged at intervals in the X direction. In addition, the number of metal masks 1 is not limited as shown in FIG. 8. In other embodiments, for example, the evaporation jig 3 can comprise a plurality of metal masks 1 and the frame 40, where the plurality of metal masks 1 can be arranged along, for example, the Y direction, and fixed to the frame 40. According to the embodiment of the present invention, based on the through-hole design of the metal mask 1, where the first spacing D1>0 μm, the second aperture H2≤the second spacing D2, 15 μm≤H2≤80 μm and H1/H2≥3, so that the structure of the evaporation jig 3 is good, the strength is better, and the evaporation area A' has flatness under an appropriate tension F, thereby contributing to the improvement of the shadow effect and the reliability and the yield rate of the evaporation result.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A metal mask, comprising:
   a metal body having a first surface and a second surface; and a plurality of regions; wherein each of the regions comprises a plurality of through-holes penetrating the metal body and respectively having openings on the first surface and the second surface, wherein each of the through-holes has:
   a first opening formed on the first surface; wherein the plurality of through-holes are spaced a first spacing between adjacent first openings on the first surface;
   a second opening formed on the second surface and smaller than the first opening; wherein the plurality of through-holes are spaced a second spacing between adjacent second openings on the second surface; and
   a third opening located within the through-hole and between the first opening and the second opening, the third opening being smaller than the second opening;
   wherein each of the through-holes further has a first length and a second length, the first length is greater than the second length, and the plurality of through-holes are spaced in a direction of the second length; wherein the third opening of each of the through-holes has a first aperture in a direction of the first length and a second aperture in the direction of the second length, and a length of the second spacing is not less than a length of the second aperture.

2. The metal mask according to claim 1, wherein a length of the first aperture is at least three times the length of the second aperture.

3. The metal mask according to claim 2, wherein the first spacing and the second spacing are not zero.

4. The metal mask according to claim 1, wherein the metal body has a thickness in a penetration direction of the plurality of through-holes, and the thickness is not more than 50 μm; the second aperture of each of the through-holes is not greater than 80 μm.

5. A metal mask according to claim 4, wherein the thickness of the metal body is not less than 15 μm and the second aperture of each of the through-holes is not less than 15 μm.

6. An evaporation jig, comprising:
   a metal mask, comprising:
   a metal body having a first surface and a second surface; and a plurality of regions; wherein each of the regions comprises a plurality of through-holes penetrating the metal body and respectively having openings on the first surface and the second surface, wherein each of the through-holes has:
   a first opening formed on the first surface; wherein the plurality of through-holes are spaced a first spacing between adjacent first openings on the first surface;
   a second opening formed on the second surface and smaller than the first opening; wherein the plurality of through-holes are spaced a second spacing between adjacent second openings on the second surface; and
   a third opening located within the through-hole and between the first opening and the second opening, the third opening being smaller than the second opening;
   wherein each of the through-holes further has a first length and a second length, the first length is greater than the second length, and the plurality of through-holes are spaced in a direction of the second length; wherein the third opening of each of the through-holes has a first aperture in a direction of the first length and a second aperture in the direction of the second length, and a length of the second spacing is not less than a length of the second aperture; and a frame comprising a first frame wall and a second frame wall, and the first frame wall and the second frame wall being located on opposite sides of the frame; wherein the metal mask has a first end and a second end in the direction of the first length, and the first end of the metal mask is connected to the first frame wall, and the second end is connected to the second frame wall to be fixed to the frame.

7. An evaporation jig according to claim 6, wherein the metal mask is further fixed to the frame and has a tension, and a direction of the tension is parallel to the direction of the first length.

8. An evaporation jig according to claim 6, wherein the metal mask further comprises a plurality of evaporation areas, each of the evaporation areas has the plurality of through-holes, and the evaporation areas are spaced apart in the direction of the first length.

\* \* \* \* \*